United States Patent [19]

Collier et al.

[11] Patent Number: 5,037,315

[45] Date of Patent: Aug. 6, 1991

[54] ELECTRICAL CONNECTORS

[75] Inventors: John C. Collier, Southport; David Lee, Warrington, both of United Kingdom

[73] Assignee: ITT Industries Limited, New York, N.Y.

[21] Appl. No.: 566,632

[22] Filed: Aug. 13, 1990

[30] Foreign Application Priority Data

Aug. 23, 1989 [GB] United Kingdom ............... 8919167

[51] Int. Cl.$^5$ ............................................ H01R 13/00
[52] U.S. Cl. ...................................... 439/83; 439/637
[58] Field of Search ..................... 439/83, 629–637

[56] References Cited

U.S. PATENT DOCUMENTS

| 3,002,176 | 9/1961 | Yopp | 339/176 |
|---|---|---|---|
| 3,479,637 | 11/1969 | Glissen | 439/634 |
| 4,468,073 | 8/1984 | Machitski | 439/629 |
| 4,545,610 | 10/1985 | Lakritz et al. | 439/83 |
| 4,606,594 | 8/1986 | Grabbe et al. | 339/74 |
| 4,636,021 | 1/1987 | Bobb et al. | 339/75 |
| 4,678,250 | 7/1987 | Roomine et al. | 439/83 |
| 4,872,851 | 10/1989 | Babuka et al. | 439/635 |

FOREIGN PATENT DOCUMENTS

| 615957 | 1/1949 | United Kingdom . |
| 2179578 | 3/1987 | United Kingdom . |
| 8602206 | 4/1986 | World Int. Prop. O. . |

Primary Examiner—Joseph H. McGlynn
Attorney, Agent, or Firm—Thomas L. Peterson

[57] ABSTRACT

An electrical connecting arrangement is provided between an electrical edge connector and a printed circuit board in which contact pads provided near the edge of the printed circuit board have a convex profile at least in the direction of insertion of the board into an opening in the edge connector. At full board insertion, each spring contact (3, FIG. 1A) of the connector engages a board contact pad (5) at a location (64) on the pad that lies beyond the center (66) of the pad.

14 Claims, 7 Drawing Sheets

ELECTRICAL CONNECTORS

BACKGROUND OF THE INVENTION

Edge connectors are used to make electrical connections to printed or wired circuit boards. This is accomplished by spring contacts of the edge connector engaging contact elements on the circuit board. The board contact elements are conventionally parallel conductive traces extending from the edge of the circuit board. It is common practice to plate these conductive strips and the engaging parts of the spring contacts with precious metal, such as gold, to avoid contact oxidation problems. However, this conventional edge connector arrangement suffers from the following disadvantages:

(a) The cut edge of the circuit board at which the groups of board contact strips terminate, tends to bite into and scuff the precious metal plating on the spring contacts. Such scuffing occurs as the board contacts engage the ends of the contact strips. Any surface debris resulting from such scuffing tends to build up in front of the spring contacts as they slide over the board contact strips, which can adversely affect the electrical connections. Scuffing that removes the gold plating on the spring contact locations that engage the board contact strips, also degrades the connections.

(b) The contact strips on the circuit board tend to be unduly large and thereby occupy valuable board space which could be utilized for accommodating other circuit components. This feature is particularly important in the case of miniaturized circuit boards using surface mounting technology.

(c) The contact pressure (force per unit volume) between the spring contacts and the board contact elements tends to be undesirably low for optimum electrical connections between the contacts.

(d) It is difficult to determine when the connector spring contacts are fully engaged with the board contacts. This is largely due to the relatively high board insertion, especially for edge connectors having large numbers of spring contacts.

It has already been proposed in U.K. Patent No. 2179578B to replace the conventional contact strips along the edge of the printed circuit board with suitably positioned relatively small contact pads which are preferably dome-shaped. Such pads are attached to the board a short distance from its edge, to be engaged by the spring contacts of the edge connector. This contact arrangement overcomes some of the aforesaid disadvantages of the conventional edge connector. The present invention is directed to further improvements in the contact pad arrangement disclosed in the above-mentioned patent.

SUMMARY OF THE INVENTION

In accordance with one embodiment of the present invention, an improved electrical connecting arrangement is provided for connecting a circuit board and an edge connector. The edge connector has an insulating body with an opening for receiving a circuit board, and a plurality of spring contacts for engaging contact elements on the board. The contact elements on the circuit board are in the form of contact pads which are spaced from an edge of the board. At least a portion of each pad is convex. During insertion of the board into the connector the contact springs can ride up and over the convex profile and come to rest on parts of the contact pads lying beyond the center line of the convex profile.

An initial positioning wall on the edge connector body can be provided to assure that the spring contacts do not engage the leading edge of the board, but instead engage only contact pads projecting from a face of the board.

The connecting arrangement avoids scuffing of the spring contact plating material by engagement with the sharp edges of contact strips of the circuit board. The final areas of contact between the spring contacts and the board contact pads, when the board is fully inserted, are not subjected to wear during insertion and withdrawal of the board from the edge connector. The spring forces exerted by the spring contacts on the contact pads, tend to urge further movement of the printed circuit board into the edge connector, as the spring contacts move beyond the center lines of the convex pad profiles. This later feature not only has the advantage of assisting full engagement between the edge connector and the circuit board, but may be utilized to provide a positive snap action connection between the board and the connector, thereby positively eliminating any uncertainty as to whether the board and connector are fully engaged.

The insulative body which receives the circuit board, includes an abutment body wall that limits the depth of board insertion. The abutment wall forms a concave groove that limits sideward movement of the leading edge of the board. The groove may be v-shaped, semi-cylindrical, or some other shape. This abutment prevents relative sideward movement between the spring contacts and contact pads when exposed to small amplitude variations. Such vibrations previously have caused "fretting corrosion" failures on tin/lead plated contacts of printed circuit/edge connectors. Failures occurred, for example, in television sets and electronic organs, due to the small amplitude vibrations generated by the loudspeakers of such equipment.

According to a third aspect of the present invention there is provided a method of attaching the contact pads having a curved profile to a printed circuit board. The printed circuit board has conductive regions of the same shape as the bases of the contact pads. When solder (e.g. solder paste) is used as the bonding material the precise location of the pads on the underlying conductive regions of the board, which are of corresponding shape, is achieved by solder reflow alignment resulting from surface tension produced in the molten solder during the solder re-flow procedure.

The positioning of the contact pads on the printed circuit boards may conveniently be achieved by the use of a "pick and place" mechanism conventionally used in surface mounting technology for the positioning of components on the board prior to bonding thereof to the board.

The novel features of the invention are set forth with particularity in the appended claims. The invention will be best understood from the following description when read in conjunction with the accompanying drawings.

BRIEF DESCRIPTION OF THE DRAWINGS

FIG. 1A is an enlarged view of a portion of the connector and circuit board of FIG. 1.

FIG. 8 is a view taken on the line 8—8 of FIG. 7a.

DESCRIPTION OF THE PREFERRED EMBODIMENTS

Figure 1:
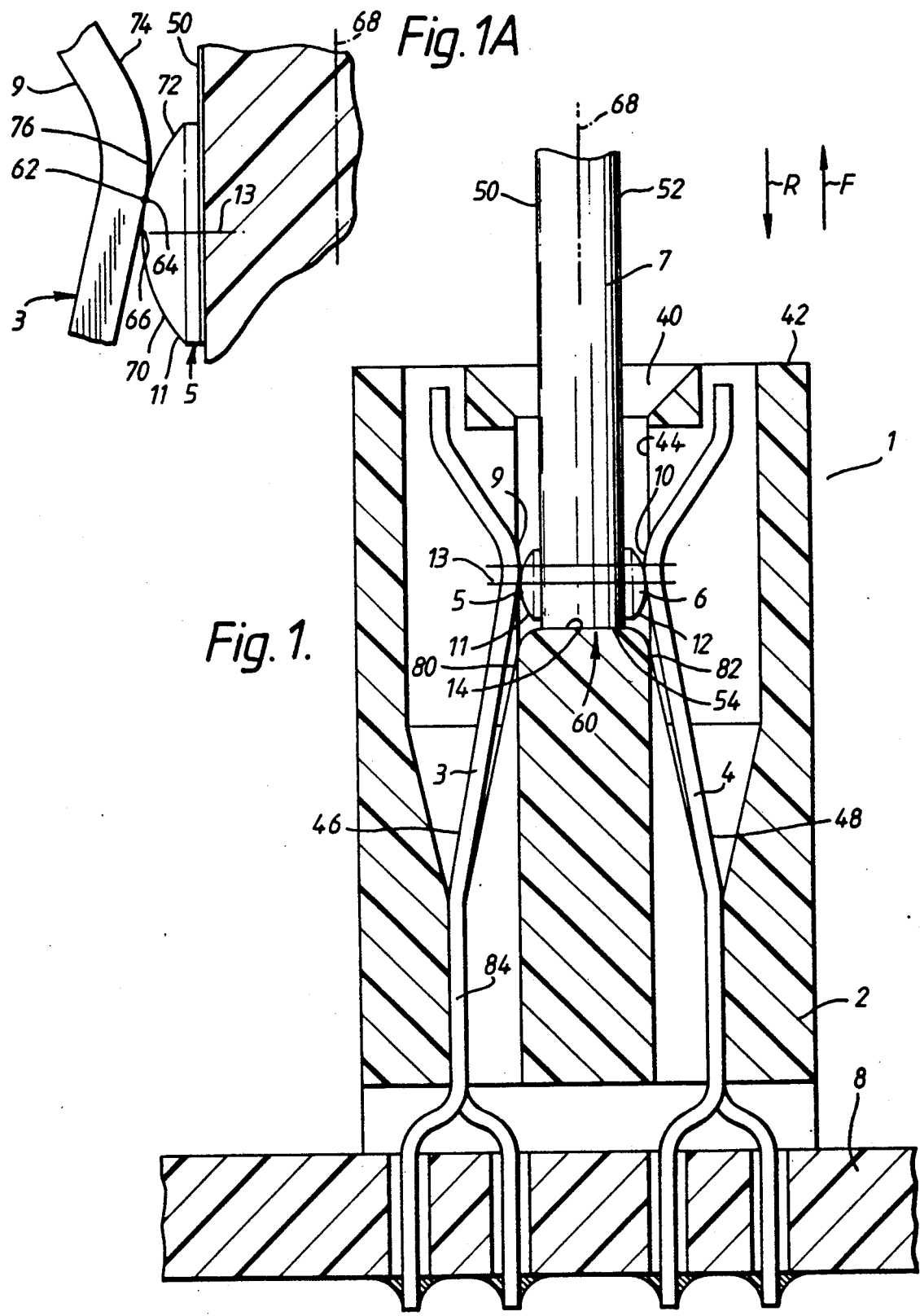
FIG. 1 is a transverse sectional view through an edge connector illustrating the engagement of spring contacts of the connector with contact elements of a printed circuit board.

FIG. 1 shows an edge connector 1 having a body 2 of insulative material with an opening 40 in its forward end portion 42 leading to a slot 44. Two rows of spring contacts 3, 4 are mounted in the body and have portions 46, 48 lying at opposite sides of the slot. A circuit board 7 is designed to be inserted in a rearward direction R (which is opposite to a forward direction F), along a centerplane 68 of the board, into the slot. The circuit board has opposite faces 50, 52 and has contact pads 5, 6 on its opposite faces, which are spaced from the leading edge 54 of the board. The edge connector itself is mounted on a circuit board 8 (e.g. backplane assembly board) by the soldering of rear portions of the spring contacts 3, 4 to conductive channels of the board 8.

The contact pads 5 and 6 each have a convex profile as seen in FIG. 1. FIG. 1 is a view taken along a direction perpendicular to the path of the circuit board as it is inserted into the edge connector. The contact pads are preferably dome-shaped, although other shapes can be used. As the circuit board is inserted, the contact pads 5 and 6 are first engaged by the convex faces of curved sections 9 and 10 of the spring contacts 5 and 6. The contact pads are first engaged at small areas or points Il and 12 on the contact pads. As the spring contacts 3 and 4 ride over the spherical surfaces of the contact pads 5 and 6, the points of mutual engagement between the contacts will be constantly changing. This results in distributing any contact wear over a considerable area of each spring contact. When the spring contacts 3 and 4 ride over the center line 13 of the domeshaped contact pads, the force exerted by the spring contacts will assist rearward movement of the board into the edge connector. The board can continue to move rearwardly until stopped by an abutment arrangement 60 formed by the leading edge 54 of the board that abuts a body wall which forms an abutment 14.

When the circuit board 7 is fully inserted, each spring contact such as 3 engages a corresponding contact pad 5 at final contacting locations 62, 64 (FIG. 1A) respectively on the spring contact and on the contact pad. The contact pad has a center 66 where it is furthest from the board face 50 and from the board centerplane 68. The centerplane of the inserted board is coincident with the centerplane of the body opening centerplane. A first side 70 the pad is inclined from the board face at an "upward" incline, wherein locations progressively further from the board leading edge 54 are progressively further from the board face. A second side 72 of the pad which is furthest from the leading edge, has a "reverse incline" where locations progressively further from the board leading edge are progressively closer to the board face 50 and centerplane 68.

The final contacting location 64 on the pad lies along the reverse incline side 72. The spring contact does not engage the pad location 64 until the board becomes fully inserted. This avoids large wear of the location 64 and of any gold plating or the like at location 64.

The curved section 9 of the spring contact has a convex side 74 containing the final contacting location 62 of the spring contact. The location 62 lies rearward of a center spring contact location 76 which is closest to the centerplane 68 of the board and the insertion path (and parallel to them). As the spring contact rides over the contact pad, the spring contact final location 62 does not engage any part of the pad until it engages the final pad location 64. This avoids large wear of the spring contact final location 62 and of any gold plating or the like on it.

The inclines of the regions contains the final contact locations 62, 64 on the spring contact and on the pad, also serve to urge the circuit board to advance rearwardly toward its final position. With a sufficient incline this can produce a "snap action" indicating full insertion of the board. In any case, the arrangement urges the board to remain in its fully inserted position and not move slightly forward and rearward. This helps avoid wear of the gold or other platings on the final contacting locations, especially if the arrangement is subjected to vibrations.

The spring contacts such as 3 avoid engaging the leading edge 54 of the board, to avoid scuffing of the spring contacts and the production of debris. The insulative body 2 of the edge connector has initial contact positioning walls 80, 82 that engage the first portions 46, 48 of the spring contacts. Each first spring contact portion such as 46 lies forward of a portion 84 that is mounted in the body, and rearward of the curved section 9. The walls such as 80 limit the initial position of contact 3, so the center spring contact location does not project as far as the board first face 50. This can prevent engagement of the spring contact with the board leading edge to avoid scuffing of the spring contact. The board-receiving opening 40 is preferably only slightly wider than the board with the contact pads thereon to accurately guide board insertion to avoid spring contact scuffing. Other board guiding arrangements can be used instead. The contact pads preferably project a considerable distance above the board face, such as more than 10% of the board thickness.

Figure 7A:
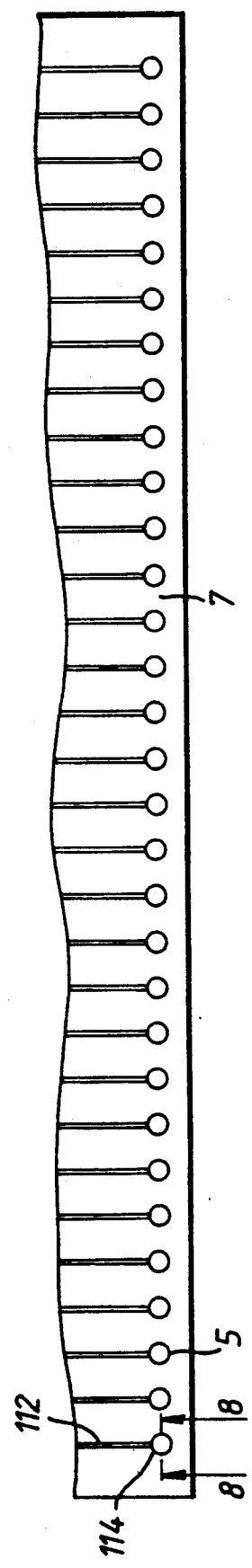
FIGS. 7A to 7D illustrate different contact pad arrangements for printed circuit boards.
Figure 7B:
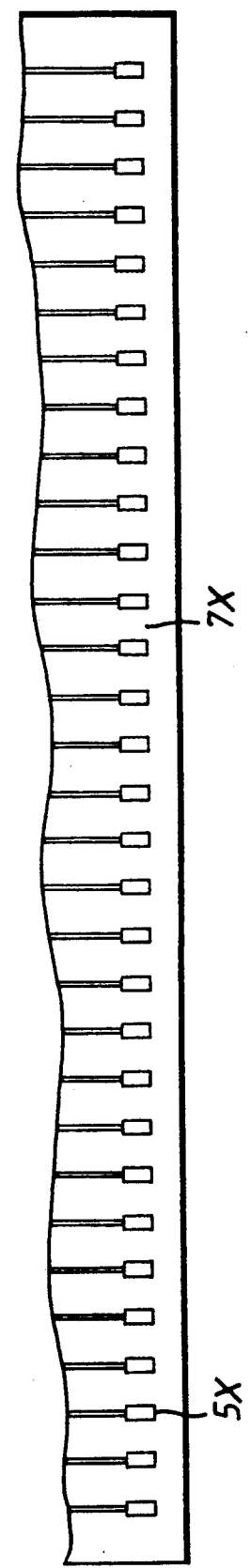
Figure 7C:
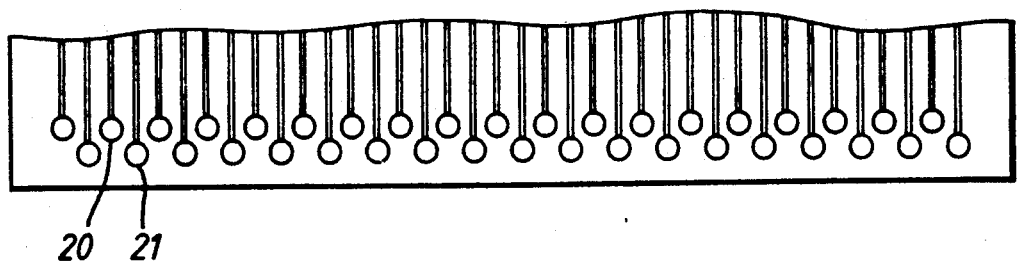

FIG. 7A shows a board 7 with contact pads 5 of dome-shape, and a circular profile in plan view. FIG. 7B shows a board 7X with contact pads having a rectangular shape as seen in plan view.

Figure 2:
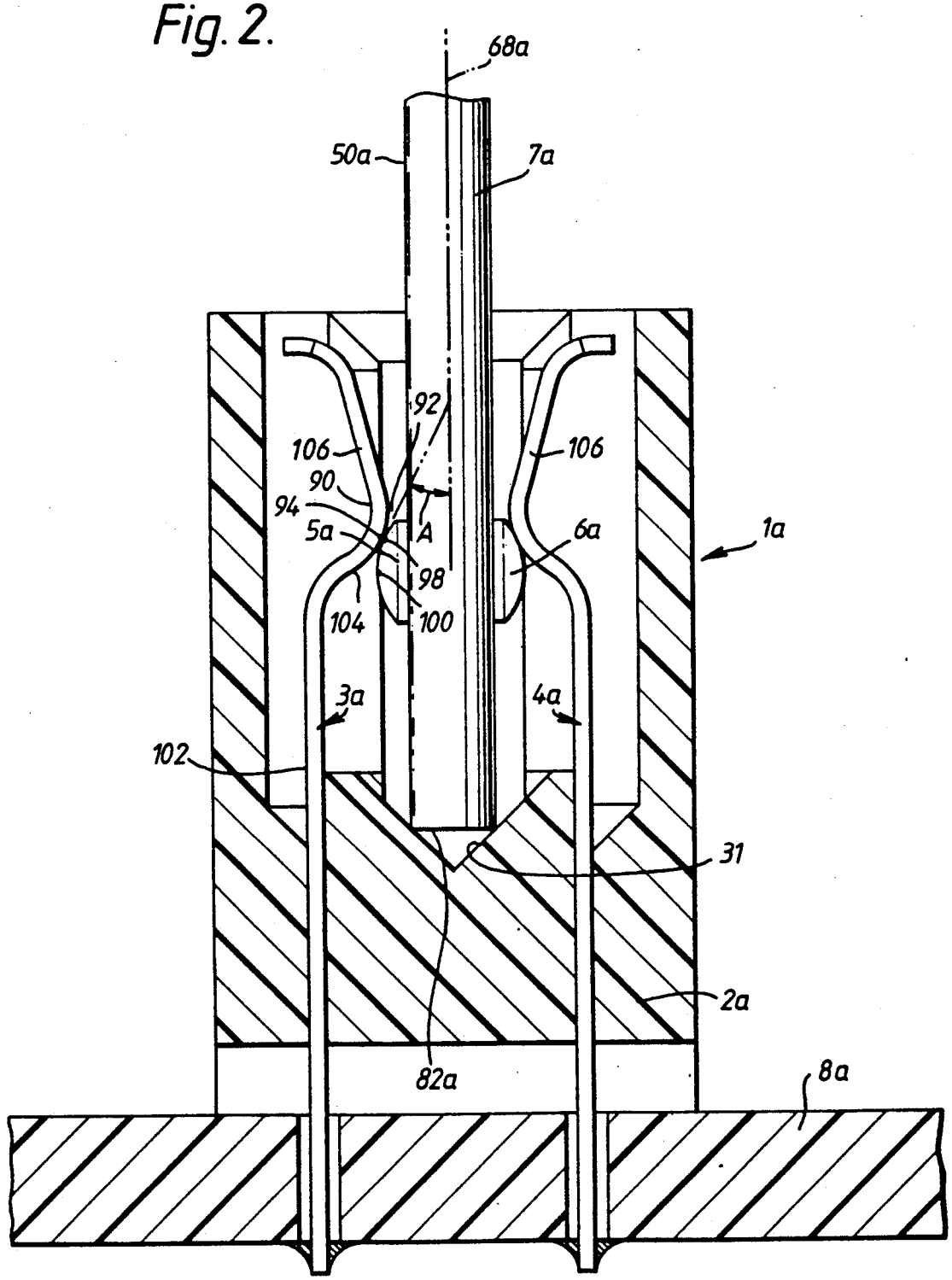
FIGS. 2 and 3 are views similar to that of FIG. 1 but illustrating different embodiments of the invention.

FIG. 2 shows an embodiment of the invention which has spring contacts 3a, 4a that are curved differently than those of FIGS. 1 and 1A. The spring contacts 3a, 4a have curved portions 90 that each have a center location 92 and a final contacting location 94. The center location 90 is the point closest to the board centerplane 68a, and is a location where the contact location is parallel to the board face 50a and centerplane 68a. The region containing the final contacting location 94 extends at a steep angle A of about 30° (15° to 60°) to the board face and centerplane. Also, the contact pad final contacting location 98 is spaced considerably forward of the center 100 of the pad (further forward than in FIGS. 1 and 1A). This results in the contacting forces of the spring contacts on the pads, producing a higher board retention force.

Each spring contact such as 3a has a first free portion 102 extending substantially (within 10°) of parallelism with the board centerplane 68a. This allows a second free portion 104 to extend at a large angle such as 60° to the board centerplane, which allows the contact location 94 to extend at a large angle A.

Figure 3:
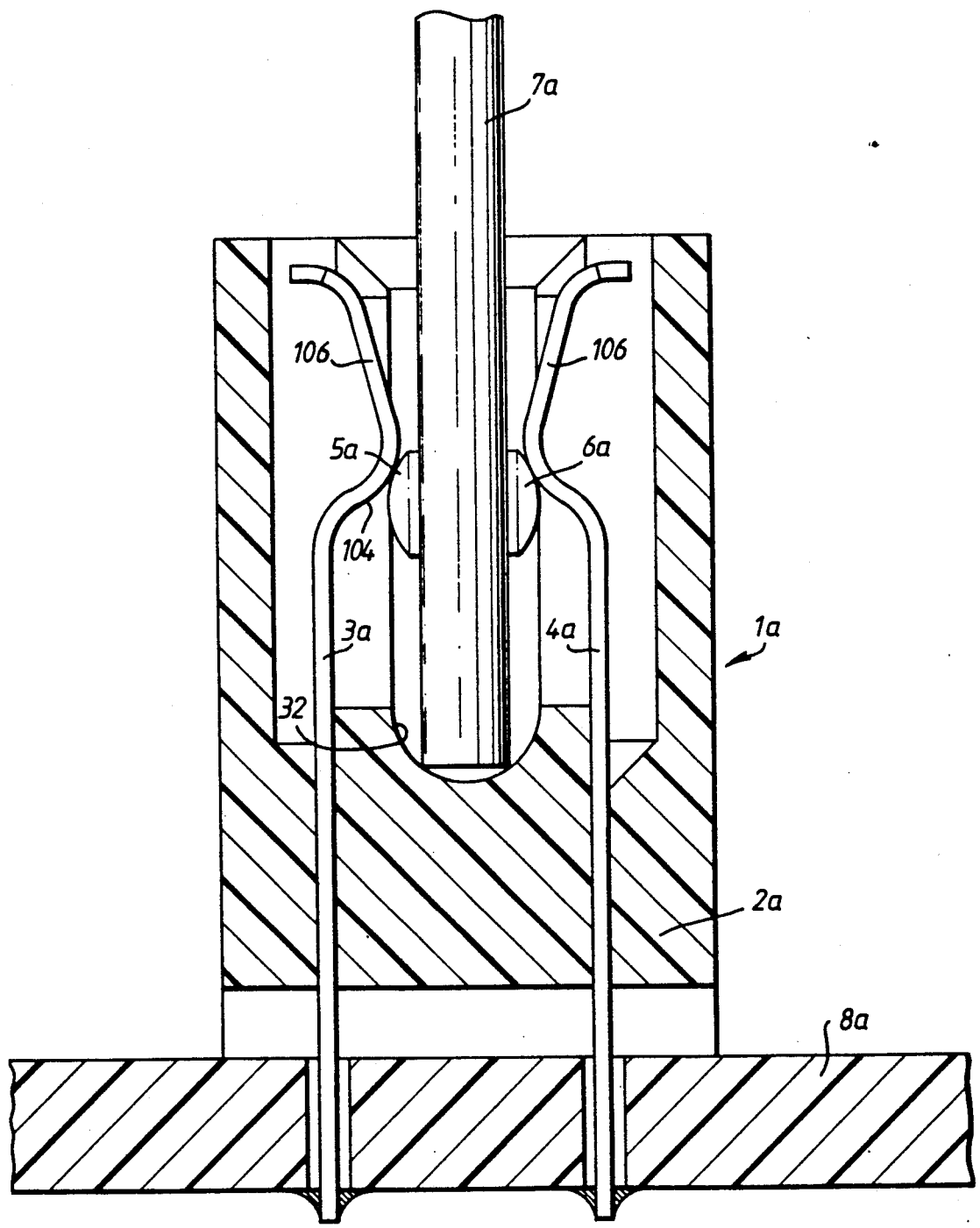

In FIG. 2, the body 2a of the edge connector has an abutment body wall which is a V-shaped groove 31. When the leading edge 82a of the board abuts the V-shaped groove, the walls of the groove restrain the board against lateral movement. This prevents relative movement between the connector contacts 3a, 4a and the co-operating board contact pads 5a, 6a under small amplitude vibration conditions which could cause wearing of the contact platings. The angle of the V is preferably no more than about 90°. The stability of the arrangement is also enhanced by positioning the contact pads 5a and 6a farther from the edge of the board than in the FIG. 1 arrangement. The arrangement of FIG. 3 is similar to that of FIG. 2 except that in FIG. 3 the edge connector has a semi-circular groove 32 which serves substantially the same function. Other concave groove configurations can be used. The spring contacts have forward free portions 106 that extend at a smaller incline to ease board insertion.

Figure 4:
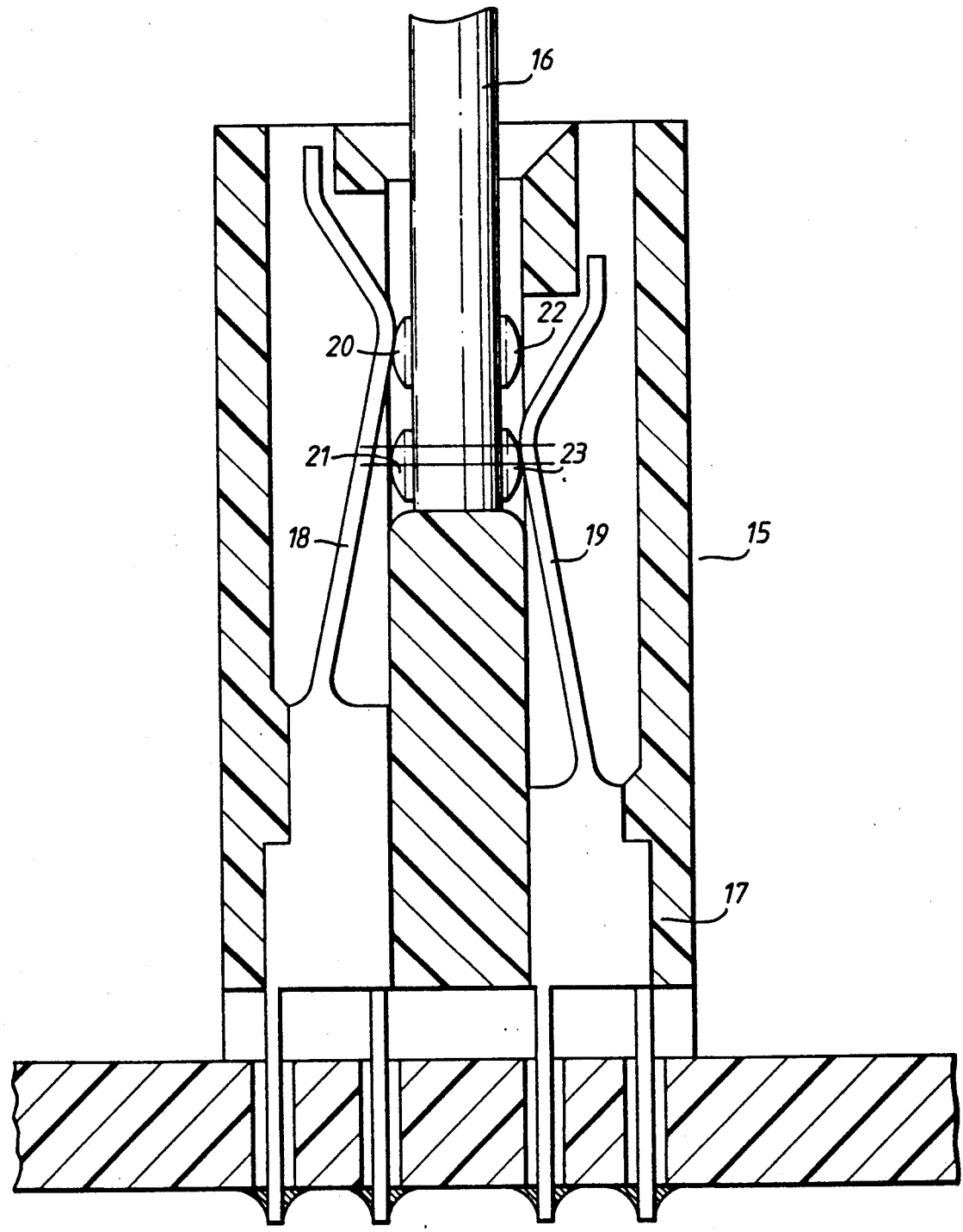
FIG. 4 is a sectional view similar to that of FIG. 1, but in which the spring contacts of the edge connector and contact pads of the printed circuit board are staggered relative to the direction of engagement of the board with the edge connector.
Figure 7D:
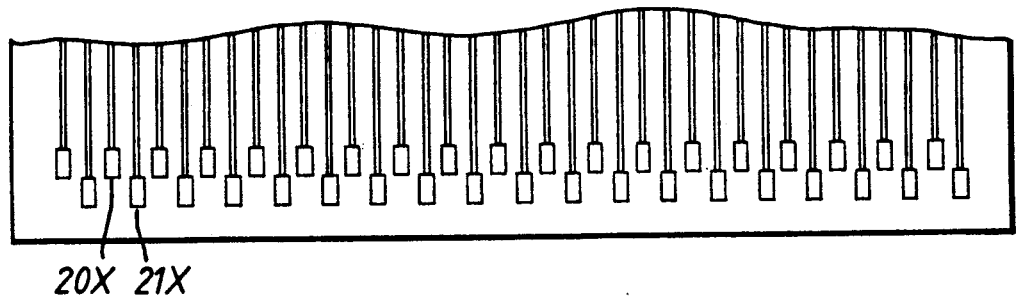

FIG. 4 shows an edge connector 15 with a printed circuit board 16 inserted therein, that each has two staggered rows of contacts or pads. The connector has an insulating body 17 holding two sets of spring contacts on either side of the board-receiving slot, with two contacts 18 and 19 being shown. Alternate spring contacts on each side are staggered. The board 16 is similarly provided on both sides with two rows of staggered contact pads 20, 21 and 22, 23. The arrangement is otherwise the same as that of FIG. 1. The staggered arrangement of the contact pads is shown in FIG. 7A for dome-shaped pads 5, and in FIG. 7D for pads 20X, 21X of rectangular shape in a plan view.

Figure 5:
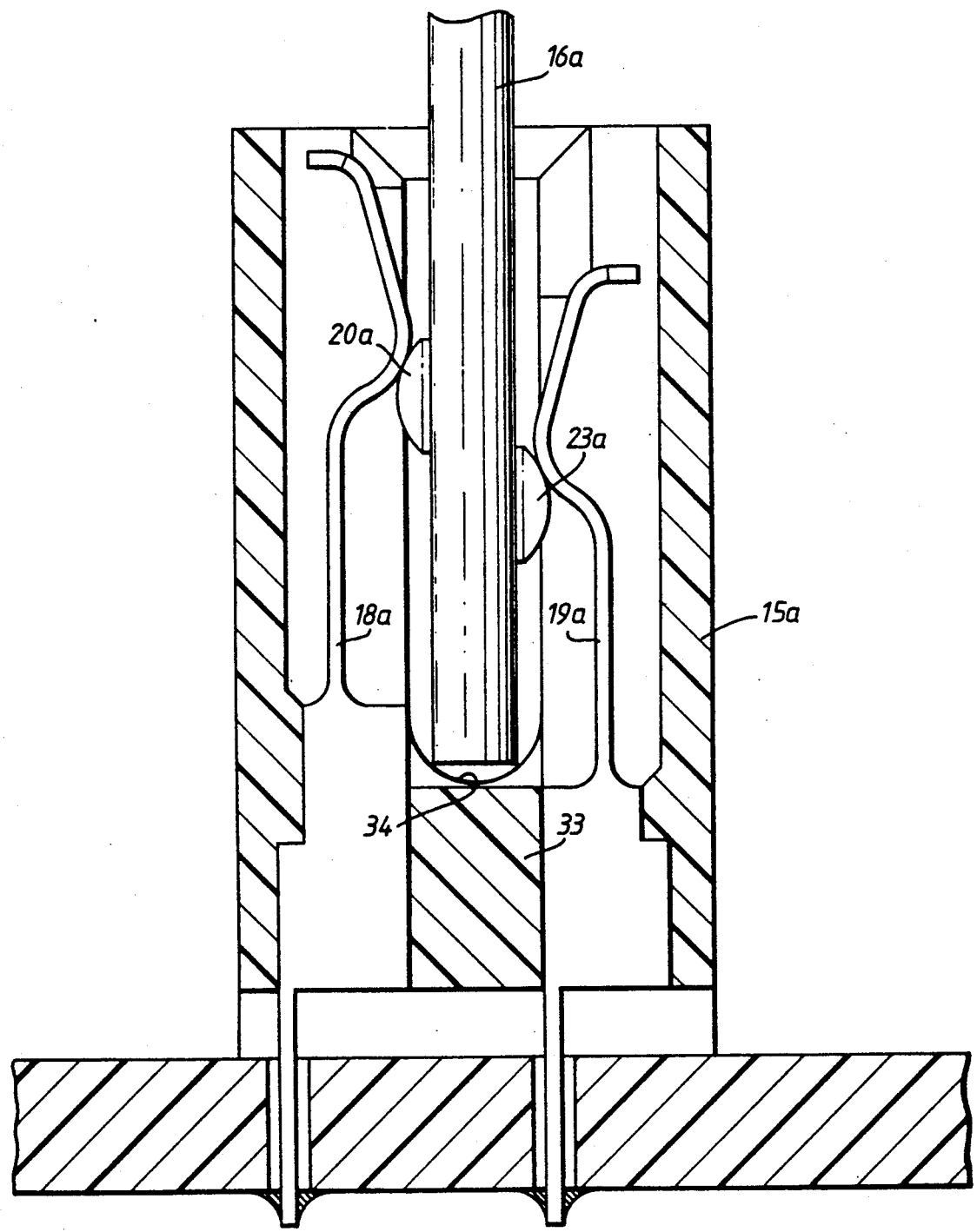
FIG. 5 is a view similar to that of FIG. 4 but illustrating a different embodiment of a staggered contact edge connector/printed board arrangement.

FIG. 5 shows an arrangement that combines the features of FIGS. 3 and FIG. 4. The spring contacts are shown at 18a and 19a and the contact pads are shown at 20a and 23a. The body of the connector 15a has an abutment part 33 with a semi-cylindrical groove 34 for receiving the end of the circuit board 16a to provide a highly stable assembly as described above.

Figure 6A:
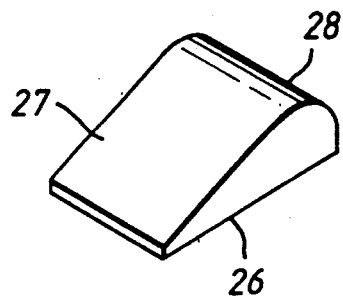
FIGS. 6A, 6B and 6C, show different contact pad profiles for use in the FIG. 1 to FIG. 5 arrangements.
Figure 6B:
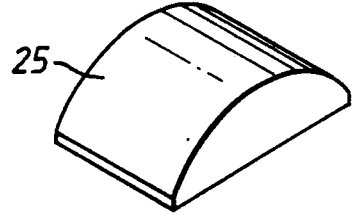
Figure 6C:
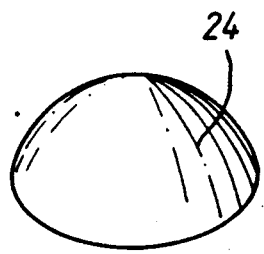

FIG. 6C of the drawings shows a dome-shaped pad 24 while FIGS. 6A and 6B show alternative forms of convex profile contact pads 25 and 26 which can be substituted for the dome-shaped pads of FIGS. 1 to 5. Pad 25 is semi-cylindrical, while pad 26 has a leading tapered inclined section 27 and a rearmost semi-cylindrical section 28. The average incline at section 28 is greater than at section 27.

Figure 8:
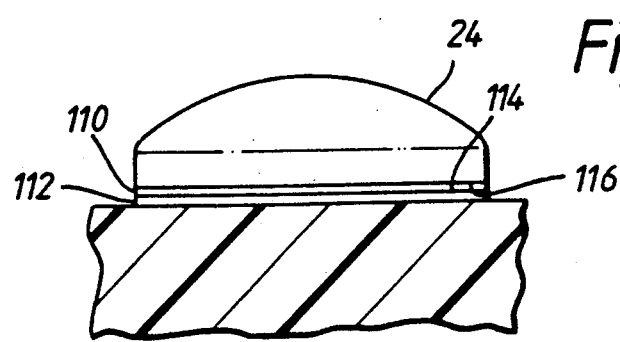

A contact pad such as the dome shaped pad 24, may be attached to a printed circuit board as shown in FIG. 8, by applying solder paste 110 to thin conductive traces 112 which have pad-mounting regions 114 of shapes and dimensions corresponding to the bases 116 of the contact pads (except for narrow trace portions leading away from the pad-holding regions). The conductive traces with regions 114 will normally be produced on the board by conventional etching techniques. The solder paste may be applied to the board using silk screening processes. Then the contact pads 24 may be positioned on the solder paste to which they will adhere as by the use of so-called pick and place mechanisms commonly used in surface mounting technology for component positioning purposes. After approximate positioning of the contact pads on the corresponding trace regions on the board, the solder is melted using solder reflow techniques. During solder reflow, the surface tension of the molten solder produces self alignment of the contact pads with respect to the correspondingly shaped conductive regions on the board, for the precise positioning of the contact pads relative to the board.

Although particular embodiments of the invention have been described and illustrated herein, it is recognized that modifications and variations may readily occur to those skilled in the art, and consequently, it is intended that the claims be interpreted to cover such modifications and equivalents.

We claim:
1. Electrical connection apparatus comprising:
an edge connector which includes an insulative body having a forward end portion with an opening for receiving a circuit board, and at least a first row of spring contacts having portion within said opening, said spring contacts having contacting locations for contacting said board;
a circuit board having parallel first and second opposite faces, an imaginary centerplane lying between said faces, and a leading edge, and having at least a first row of contact pads on said first face for engagement with said spring contacts when said board is inserted into said opening, said connector and board forming an abutment arrangement that limits insertion of said board to a predetermined fully inserted position;
said contact pads each having a reverse inclined region that is inclined from said first board centerplane so locations progressively further from said leading edge lie progressively closer to said centerplane;
said contacting locations of said spring contacts are positioned so they engage said inclined regions on said contact pads when said board is inserted to said fully inserted position.
2. The apparatus described in claim 1 wherein:
said body has a wall lying rearward of said opening to abut said board leading edge, said wall forming said abutment and having a concave forwardly-facing surface for abutting said board leading edge and resisting lateral movement of the fully inserted board.
3. The apparatus described in claim 1 wherein:
said contact pads are each dome shaped.
4. The apparatus described in claim 1 wherein:
said contact pads each have first and second sides lying respectively closest and furthest from said board leading edge, and each pad has a center between said sides, said second side forming said reverse inclined region, and said first side is inclined so locations progressively further from said leading edge lie progressively further from said centerplane, the average incline of said second side being greater than the incline of said first side.
5. The apparatus described in claim 1 wherein:
said body has a slot which confined said board to movement along a predetermined path;
said contact pads project from said first board face;
said body has initial contact positioning walls which limit the distance by which said spring contacts can project into said slot to substantially prevent said spring contacts from engaging said board leading edge while allowing said spring contacts to engage said contact pads.

6. The apparatus described in claim 1 wherein:
said spring contacts each have a rearward mounting portion securely held in said body and a curved region lying forward of said mounting portion where said spring contact has a convex side facing said board, each curved region including one of said spring contact contacting locations and each curved region having a center location that is parallel to said board centerplane;
the contacting location of each spring contact lies slightly rearward of said curved region center location.

7. The apparatus described in claim 6 wherein:
said body has a centerplane that is coincident with said board centerplane when said board is inserted into said body;
said spring contacts each have a first portion extending primarily in a forward direction, and a second portion extending at an incline of at about 30° from said board centerplane toward said board centerplane and merging with said curved region.

8. In electrical connection apparatus which includes an edge connector having an insulative body with a front portion having an opening for receiving a circuit board and an abutment rearward of said opening for abutting the leading edge of the circuit board to limit the depth of insertion of the board, and with a plurality of spring contacts with curved regions lying behind said opening for contacting conductive pads on a face of the boards, the improvement wherein:
said conductive pads each has first and second sides lying respectively closest and furthest from said leading edge, said second side having a reverse inclined region that is inclined from said board face to lie progressively closer to said board face at locations progressively further from said leading edge, and said leading edge is positioned so said curved regions of said spring contacts bear against said inclined region when said leading edge abuts said abutment.

9. The improvement described in claim 8 wherein:
said contact pads are dome shaped.

10. An electrical edge connector for receiving a circuit board having a leading edge, a face, and a plurality of contact pads on said face that project from said face so the width of said board and contacts thereon is at least ten per cent greater than the width of said board alone, comprising:
an insulative body having walls forming a board receiving opening and a plurality of spring contacts for contacting said pads, said body having an abutment positioned to abut said board leading edge when the board is fully inserted, said board receiving opening being much wider than the width of said circuit board so said walls forming said opening cannot position said circuit board;
said abutment having a concave surface positioned to abut said board leading edge and resist substantially any lateral movement of the fully inserted board, with said concave surface having opposite sides positioned so each abuts a fully inserted board, with said opposite sides angled by no more than about 90° from each other at locations of said opposite sides that abut said board leading edge.

11. The connector described in claim 10 wherein:
said concave surface of said abutment is substantially V-shaped, with the sides of the V forming an angle that is no more than 90°.

12. The connector described in claim 10 wherein:
said concave surface of said abutment is of substantially semi-cylindrical shape.

13. Electrical connection apparatus comprising:
an edge connector which includes an insulative body having a forward end portion with a slot for receiving a circuit board, and at least a first row of spring contacts having portion within said slot, said spring contacts having contacting locations for contacting said board;
a circuit board having a leading edge, a first face, and at least a first row of contact pads on said first face for engagement with said spring contacts when said board is inserted into said slot, said body confining said board to movement along a predetermined path along said slot;
said contact pads project from said first board face;
said body has initial contact positioning walls located at fixed positions relative to the rest of said body, which limit the distance by which said spring contacts can project into said slot to substantially prevent said spring contacts from engaging said board leading edge while allowing said spring contacts to engage said contact pads that project from said board as said board is inserted along said slot.

14. The apparatus described in claim 13 wherein:
said contact pads project from said first board face by a distance that is more than 10% of the thickness of said board.

* * * * *